US009478705B2

(12) United States Patent
Balkenende et al.

(10) Patent No.: US 9,478,705 B2
(45) Date of Patent: Oct. 25, 2016

(54) SOLID STATE LIGHT EMITTING DEVICES BASED ON CRYSTALLOGRAPHICALLY RELAXED STRUCTURES

(71) Applicant: Koninklijke Philips N.V., Eindhoven (NL)

(72) Inventors: Abraham Rudolf Balkenende, Eindhoven (NL); Marcus Antonius Verschuuren, Eindhoven (NL); George Immink, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/629,581

(22) Filed: Feb. 24, 2015

(65) Prior Publication Data

US 2015/0171273 A1    Jun. 18, 2015

Related U.S. Application Data

(63) Continuation of application No. 13/879,824, filed as application No. PCT/IB2011/054680 on Oct. 20, 2011, now Pat. No. 8,969,890.

(30) Foreign Application Priority Data

Nov. 4, 2010 (EP) ..................................... 10189976

(51) Int. Cl.
*H01L 33/00* (2010.01)
*H01L 33/24* (2010.01)
(Continued)

(52) U.S. Cl.
CPC ........... *H01L 33/24* (2013.01); *H01L 21/0237* (2013.01); *H01L 21/0254* (2013.01);
(Continued)

(58) Field of Classification Search
CPC ...................................................... H01L 33/08
USPC .............................................. 257/89; 438/35
See application file for complete search history.

(56) References Cited

U.S. PATENT DOCUMENTS 5,795,798 A * 8/1998 Mishra et al. ................. 438/35
6,133,589 A   10/2000 Krames et al.
(Continued)

FOREIGN PATENT DOCUMENTS

CN    101681813 A    3/2010
EP    1589593 A2    10/2005
(Continued)

OTHER PUBLICATIONS

Translation of KR 10-0857410, Dec. 2015.*
(Continued)

*Primary Examiner* — Mark Prenty

(57) ABSTRACT

The present invention discloses a method for manufacturing a solid state light emitting device having a plurality of light-sources, the method comprising the steps of: providing a substrate having a growth surface; providing a mask layer on the growth surface, the mask layer having a plurality of openings through which the growth surface is exposed, wherein a largest lateral dimension of each of said openings is less than 0.3 μm and wherein the mask layer may comprise a first mask layer portion and a second mask layer portion, having the same surface area and comprising a plurality of openings wherein the first mask layer portion exhibits a first ratio between an exposed area of the growth surface and an unexposed area of the growth surface, and wherein the second mask layer portion exhibits a second ratio between an exposed area of the growth surface and an unexposed area of said growth surface, the second ratio being different from the first ratio; growing a base structure on the growth surface in each of the openings of the mask layer; and growing at least one light-generating quantum well layer on the surface of each of the base structures.

23 Claims, 4 Drawing Sheets

(51) Int. Cl.
   *H01L 21/02*  (2006.01)
   *H01L 27/15*  (2006.01)
   *H01L 33/06*  (2010.01)
   *H01L 33/08*  (2010.01)
   *H01L 33/04*  (2010.01)
   *H01L 33/32*  (2010.01)
   *H01L 33/12*  (2010.01)

(52) U.S. Cl.
   CPC ..... *H01L21/0262* (2013.01); *H01L 21/02458* (2013.01); *H01L 21/02639* (2013.01); *H01L 27/156* (2013.01); *H01L 33/007* (2013.01); *H01L 33/04* (2013.01); *H01L 33/06* (2013.01); *H01L 33/08* (2013.01); *H01L 33/32* (2013.01); *H01L 33/0075* (2013.01); *H01L 33/12* (2013.01)

(56) References Cited

U.S. PATENT DOCUMENTS

| | | | |
|---|---|---|---|
| 6,773,946 | B2 | 8/2004 | Moon et al. |
| 7,002,182 | B2* | 2/2006 | Okuyama ............... H01L 33/24 257/103 |
| 7,034,328 | B2 | 4/2006 | Doverspike et al. |
| 8,519,378 | B2* | 8/2013 | Hiruma ............... H01L 27/153 257/13 |
| 2008/0012030 | A1 | 1/2008 | Yoon et al. |
| 2008/0124827 | A1 | 5/2008 | Huang et al. |
| 2008/0149946 | A1 | 6/2008 | Kim et al. |
| 2008/0157057 | A1 | 7/2008 | Kim |
| 2010/0148147 | A1 | 6/2010 | Bour et al. |
| 2013/0214251 | A1 | 8/2013 | Balkenende et al. |

FOREIGN PATENT DOCUMENTS

| | | | | |
|---|---|---|---|---|
| JP | 2003-158296 | A | | 5/2003 |
| JP | 2008-016847 | A | | 1/2008 |
| JP | 2009-009978 | A | | 1/2009 |
| JP | 2009-049209 | A | | 3/2009 |
| JP | 2009-176906 | A | | 8/2009 |
| JP | 2009-206449 | A | | 9/2009 |
| KR | 10-0857410 | | * | 9/2008 |
| TW | 201027800 | A1 | | 7/2011 |
| WO | 2008078297 | A2 | | 7/2008 |
| WO | WO 2010/044129 | A1 | * | 4/2010 ............. H01L 33/00 |
| WO | WO-2010044129 | A1 | | 4/2010 |

OTHER PUBLICATIONS

China Application No. 201180053408.X, First Office Action dated Jun. 17, 2015, 27 pages.

China Application No. 201180053408.X, Second Office Action dated Jan. 14, 2016, 27 pages.

EPO as ISA, PCT/IB2011/054680 filed Oct. 20, 2011, "International Search Report and Written Opinion", mailed Feb. 24, 2012, 10 pages.

Japan Application No. 2013-537226, First Office Action dated Aug. 18, 2015, 6 pages.

L. Jay Guo, "Nanoimprint Lithography: Methods and Material Requirements", Wiley InterScience, Advanced Materials 2007, vol. 19, pp. 495-513.

Taiwan Application No. 100140201, First Office Action dated Aug. 13, 2015, 11 pages.

* cited by examiner

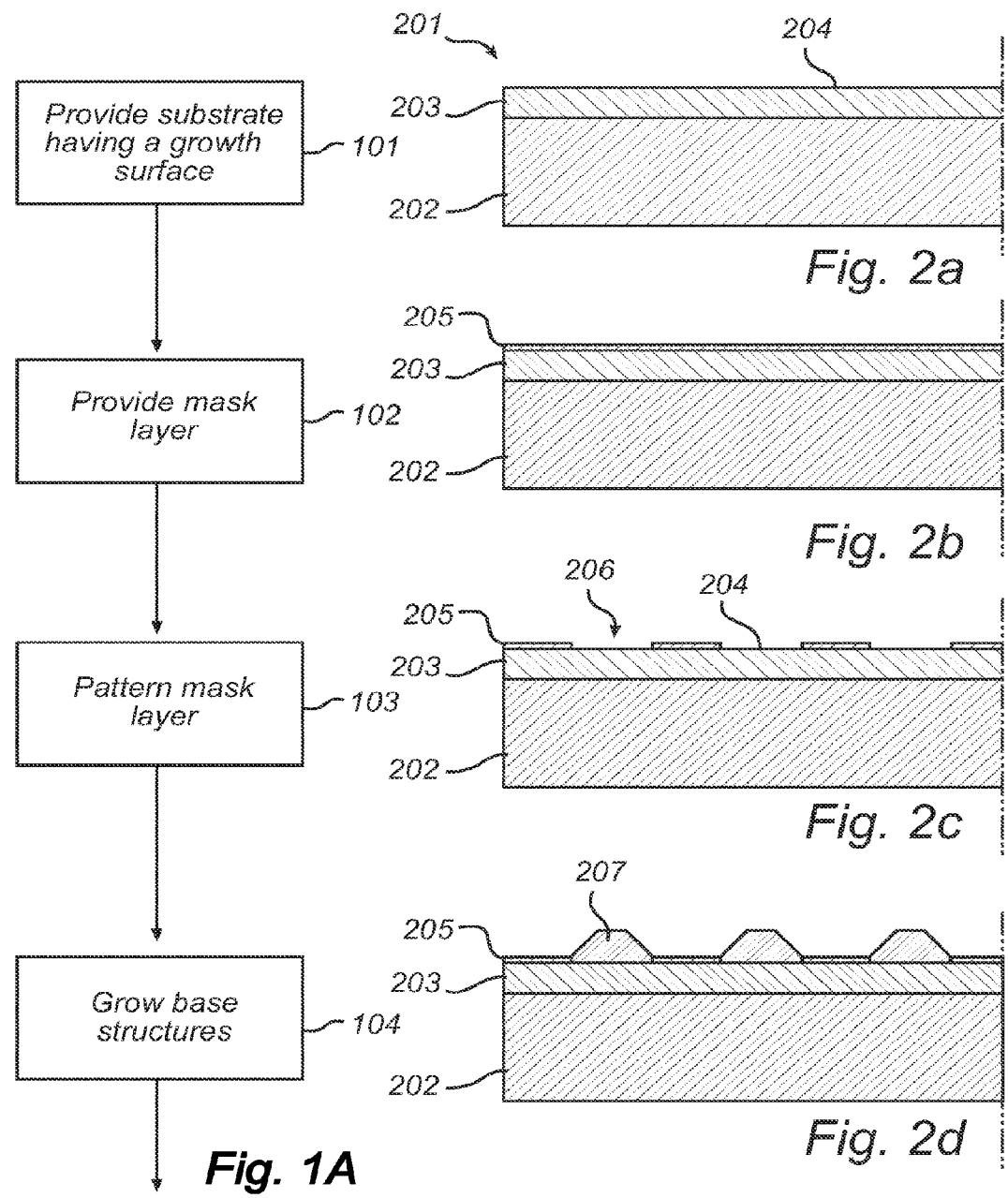

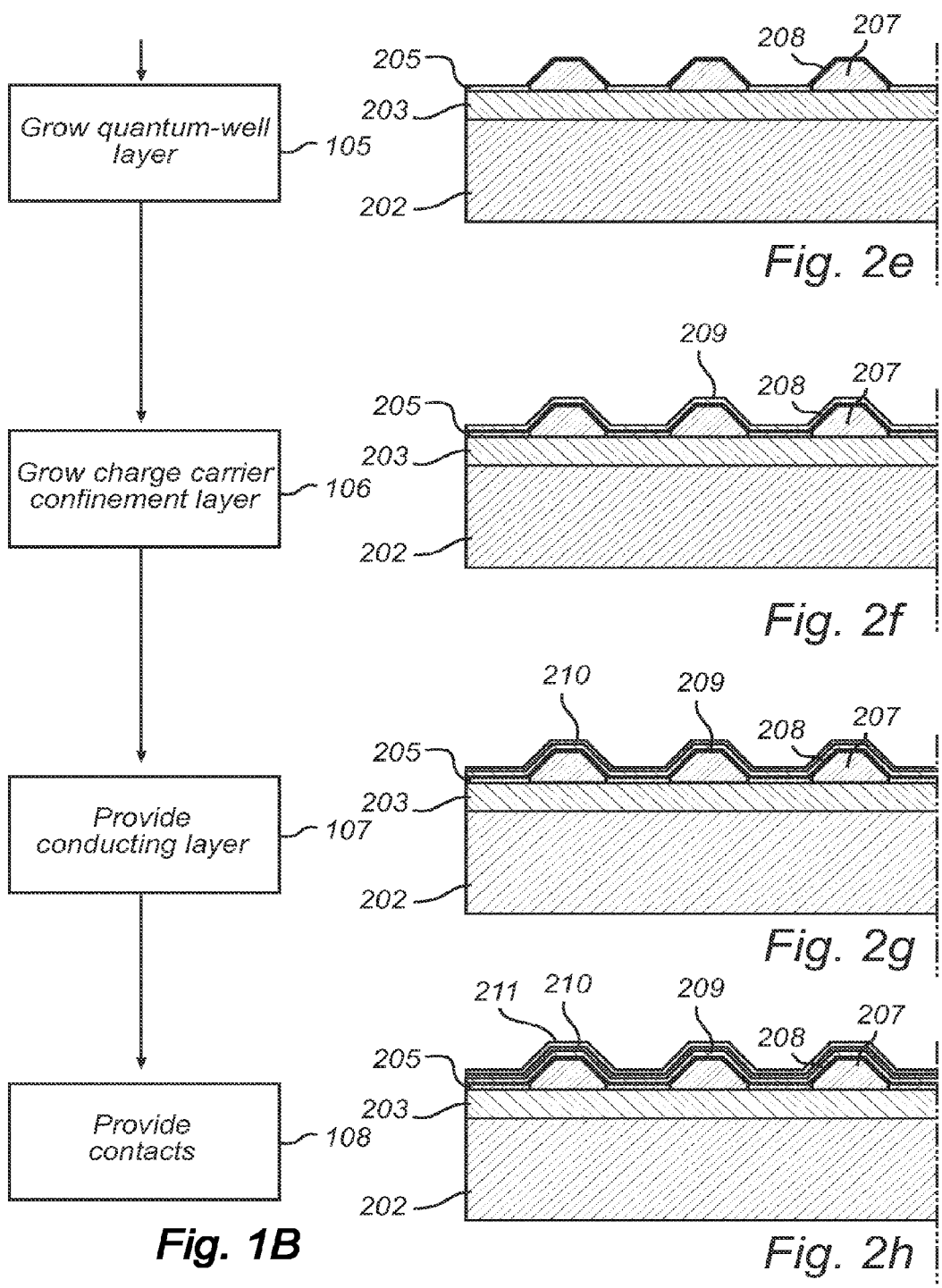

SOLID STATE LIGHT EMITTING DEVICES BASED ON CRYSTALLOGRAPHICALLY RELAXED STRUCTURES

CROSS-REFERENCE TO RELATED APPLICATIONS

This application is a continuation of U.S. patent application Ser. No. 13/879,824, filed Apr. 17, 2013, which is a 371(c) national stage entry of PCT/IB11/54680 filed on Oct. 20, 2011, which is the international application of EP 10189976.3 filed on Nov. 4, 2010. U.S. Ser. No. 13/879,824 and EP 10189976.3 are incorporated herein by reference.

FIELD OF THE INVENTION

The present invention relates to solid state light emitting devices and to a method for manufacturing such solid state light emitting devices.

BACKGROUND OF THE INVENTION

Solid state light emitting devices such as light emitting diodes (LEDs) and solid state lasers are used in a wide range of applications from conventional lighting systems to optical communication systems. In particular, nitride based LEDs enable the use of LEDs for general lighting purposes. However, emission efficiency for such devices drops considerably for wavelengths above 480 nm. A way to compensate this is to use blue emitting LEDs in such a way that part of the emitted blue light is converted to green-yellow light by interaction with a phosphorescent material. However, phosphorescent conversion suffers from several conversion loss mechanisms during the transition from a higher energy radiation to lower energy radiation resulting in limited conversion efficiency while also the emission peak shape is broadened. Therefore, LEDs emitting directly in the green to red parts of the visible spectrum would provide considerable benefits such as eliminated conversion losses and improved color tunability.

For example, gallium nitride (GaN) based light sources can be adapted to shift the emission wavelength towards the red end of the visible spectrum. WO2008/078297 discloses a method for manufacturing a GaN-based semiconductor light emitting device configured to emit multiple wavelengths of light. This is achieved by forming a plurality of posts from a mask layer having a plurality of openings, where each post comprises a light emitting layer disposed between an n-type and a p-type region. The emitted wavelength is controlled by the diameter of the post.

SUMMARY OF THE INVENTION

In view of the aforementioned prior art, it is an object of the present invention to provide an improved method for fabrication of solid state light emitting devices, and in particular an improved method for fabricating solid state light emitting devices enabling fabrication of devices emitting wavelengths in the green to red part of the visible spectrum.

According to a first aspect of the present invention, it is therefore provided a method for manufacturing a solid state light emitting device having a plurality of light-sources, the method comprising the steps of: providing a substrate having a growth surface; providing a mask layer on the growth surface, the mask layer having a plurality of openings through which the growth surface is exposed, wherein a largest lateral dimension of each of said openings is less than 0.3 μm and wherein the mask layer comprises a first mask layer portion and a second mask layer portion, having the same surface area and comprising a plurality of openings wherein the first mask layer portion exhibits a first ratio between an exposed area of the growth surface and an unexposed area of the growth surface, and wherein the second mask layer portion exhibits a second ratio between an exposed area of the growth surface and an unexposed area of said growth surface, the second ratio being different from the first ratio; growing a base structure on the growth surface in each of the openings of the mask layer; and growing at least one light-generating quantum well layer on the surface of each of the base structures.

The term "solid state light emitting devices" should in the present context be understood as semiconductor-based light emitting devices such as photoluminescent devices, LEDs, laser diodes or vertical cavity surface emitting lasers (VCSELs). A light source should in the present context be understood as each individual structure which emits light either in an electrically driven device through direct emission or in a passive device through a photoluminescent reaction following photoexcitation.

The light-generating quantum well (QW) layer is a thin layer of a material having a lower energy band gap than the surrounding materials, thereby forming a potential well. Light is generated when charge carriers recombine over the bandgap and the size of the bandgap determines the wavelength of the emitted light. Charge carriers can be provided either through electrical injection in an electrically driven device or through photoexcitation in a passive device. By growing the light-generating quantum well layer on an at least partially relaxed base structure it is possible to achieve material compositions, and thereby band gap energies, in the quantum well layer not possible to achieve on a non-relaxed surface. Thus, providing at least partially relaxed base structures promotes growth of a quantum well layer with desirable light-emitting properties not achievable on a non-relaxed surface. In particular, it is possible to grow quantum wells having emission peaks in the red part of the visible spectrum. It is equally possible to grow multiple quantum wells stacked on the base structure in order to manufacture light emitting devices such as LEDs, laser diodes and VCSELs. Furthermore, limiting the size of the openings to achieve the growth of relaxed structures also enables the use of non-lattice matched substrates which would otherwise give rise to stress related problems commonly occurring when growing larger structures or continuous films.

The present invention is based on the realization that the properties of light-sources based on crystallographically relaxed structures, epitaxially grown on a growth surface in openings of a certain size, can be controlled by controlling the relative size and separation distance of the openings, and in particular by controlling the ratio between the exposed growth surface area and the mask layer area.

As base structures which are at least partially relaxed allow subsequent growth of a light-generating quantum well layer with properties different from what is possible to grow on strained material, it is desirable to achieve such crystallographically relaxed base structures. Provided that a largest lateral dimension of each of the openings is less than 0.3 μm, local surface relaxation will reduce or eliminate the stress that otherwise would result from a lattice mismatch between the lattice constant of the growth surface and lattice constant of the base structure. The largest lateral dimension of f.i. a polygon is the largest diagonal, i.e. the largest line segment connecting two different non-sequential corners of the polygon. The largest allowable size of each of the openings to achieve relaxed base structures is for a selected material combination determined by material parameters such as Young's modulus and lattice constant.

The wavelength of the light emitted from a quantum well is related to the quantum well thickness which in turn is a result of the growth conditions used when growing the quantum well layer. As a precursor is provided, commonly in gas or vapor form, the precursor can be assumed to uniformly reach the entire surface of the wafer in a common rotating wafer configuration during deposition. Since growth only takes place on the base structures and not on the mask layer surface, precursor material deposited on the mask layer surface migrates towards the openings containing the base structures, there contributing to quantum well growth. Thus, the ratio between exposed and unexposed growth surface area determines the amount of precursor material available to grow the quantum well layer. As a result, a portion of the wafer where a larger fraction of the growth surface is exposed results in thinner quantum wells than on a portion of the wafer where a smaller fraction of the growth surface is exposed.

Hence, the size of the opening in combination with the separation will then determine the relative growth rate and thereby the thickness of QWs grown on a particular base structure. The combination of opening size and separation distance is thus a strong means to tune QW thickness and thereby emission color from a specific light source.

A substrate acting as a carrier may be provided. The substrate may advantageously be a wafer in a conducting material enabling contacting of the backside of the substrate. More specifically, the substrate may comprise a material selected from the group consisting of GaN, sapphire, silicon, SiC, ZnO, ScN, TiN, HfN, AlN, $ZrB_2$, $HfB_2$, $NbB_2$, BP, GaAs, GaP, $LiGaO_2$, $NdGaO_3$, $LiAlO_2$, $ScMgAlO_4$, garnet and spinel.

A growth surface may be provided on an upper surface of the substrate where the growth surface promotes growth of the desired relaxed base structure. In the present context a growth surface may advantageously be a surface suitable for epitaxial growth of a group III-V semiconductor-based material, more specifically the growth surface may be suitable for epitaxial growth of GaN based materials. For electrically driven devices, a GaN based n-doped growth layer may be used.

A mask layer may be arranged on top of the growth surface and openings may be created in the mask layer exposing the growth surface. The mask layer may advantageously be insulating as is the case for a $SiO_2$ based material. The mask layer may also be selected from a wide range of insulating materials such as $SiN_x$, $TiO_2$, $ZrO_2$ or similar oxides, nitrides or carbides.

Epitaxial growth of the base structures starts at the exposed growth surface, meaning that no growth takes place on the surface of the mask layer. Consequently the openings in the mask layer define where base structures are grown. The main purpose of the base structure is to function as a base for subsequent growth of a light-generating quantum well layer which may be grown as a continuous film on the surface of the base structure. For electrically driven solid state lighting devices, the base-structure is preferably n-doped.

It should also be noted that for a photoluminescent device, quantum wells are not strictly required. In a photoluminescent device, the base structures may be the light emitting structures, although also in such devices quantum wells may be used for additional control of the light emitting properties.

According to one embodiment of the present invention, the plurality of openings are of substantially the same size and the distance between adjacent openings is greater in the second mask layer portion than in the first mask layer portion. Hereby, it is possible on a single wafer to tailor the quantum well properties to be different in different portions of the device while using substantially the same opening size in the first and second portions. Needless to say, there may be more than two mask layer portions having mutually different distances between openings.

This provides for a highly flexible way of simultaneously producing on the same surface a combination of light sources emitting different wavelengths, while being able to use an optimal opening size so that relaxed base structures can be grown in all openings if desired.

Put in slightly different words, the density of openings of substantially the same size may be different in the first and second mask layer portions. For example, the openings may be arranged substantially regularly, and the pitch may vary between the two portions.

The distance between openings may, for example, be at least 10% greater in the second mask layer portion than in the first mask layer portion, whereby a substantial color difference can be achieved while still growing the light-generating quantum well layers on relaxed base structures. By locally varying separation distance of the openings and/or opening size, the emitted wavelength can be tuned locally. By doing this over relatively large areas of a device (large enough to be contacted separately) the device becomes segmented and thereby color tunable. On the other hand, by randomly or quasi-randomly varying either or both of opening size and separation, thus varying QW thickness, a highly uniform mixture of light-sources with different wavelengths may be obtained, which can be an advantage in applications that are highly demanding from a uniformity point of view. Furthermore, the possibility to tailor emission in combination with the possibility to emit wavelengths covering the visible spectrum, as a result of using relaxed base structures, makes it possible to produce LED devices emitting white light.

According to another embodiment of the present invention, each opening in the plurality of openings has a polygon shape, wherein at least one side of the opening is aligned substantially parallel to a crystallographic orientation of the growth surface;

The shape of the opening will have an effect on the lattice structure of the crystal planes that constrain the polyhedron grown from the polygon shaped opening. Different crystal planes in the base structure may possess different growth properties, thereby resulting in a different material composition or layer thickness of the grown light-generating quantum well layer. A different material composition or thickness of the quantum well may lead to a shift in emission wavelength. The differences in quantum well properties corresponding to different crystal planes of the base structure may be relatively small and will in that case mainly lead to an apparent broadening of the total emission peak. A broader emission peak results in a more continuous emission spectrum, thus leading to a better color perception of the emitted light. The effect of different crystal planes with different properties will as an example be evident for polyhedrons shaped as truncated pyramids, where a quantum well grown on the top surface is likely to exhibit not only a different material composition, but also a notably different growth rate compared to a quantum well grown on the side walls of the pyramid. Additionally, for pyramids, the total growth area of the structure (initially the opening in the mask) grows once the pyramid shape starts forming and more so when the pyramid is overgrowing the mask, implying that the relative growth rate perpendicular to the surface starts decreasing. This can be exploited as this effect will occur earlier and to a larger extent with small sized holes at a relatively small separation distance.

A different growth rate of the QWs at different planes is one way in which the color of emitted light can be tuned more strongly as this will result in QWs of different thickness. The thickness of a quantum well directly determines the extent of quantum confinement, which in turn (in combination with material composition and strain induced by lattice mismatch) determines the wavelength of the emitted light.

Furthermore, the alignment of the openings may advantageously be selected so that all sides of the base structures are equivalent with respect to the growth surface which results in a higher degree of uniformity over the device area.

Additionally, a controlled shape and alignment of the opening may advantageously lead to a base structure with fewer crystallographic defects, thereby reducing the risk of non-radiative recombination centers which reduce the efficiency of the device.

In the case of strong misalignment between the sides of the openings and the underlying crystallographic structure, the grown structure will partly align to various crystallographic directions. For example, a misaligned quadratic opening may result in a grown structure which is facetted, meaning that a polyhedron with 6 or 8 sides may be grown. However, some misalignment may be allowed as the grown structures inherently align to the preferred growth directions.

In one embodiment of the present invention, the shape of the opening may advantageously be hexagonal. By aligning the sides of the grown base structures to a desired underlying crystallographic orientation, making all sides of the structure equivalent, it is possible to achieve a higher uniformity and thereby a better defined emission wavelength, which may be favorable when monochromatic emission is desired. The shape of the opening may equally well be triangular, rectangular or any other polygon depending on the crystallographic structure of the growth surface.

According to one embodiment of the present invention, the method for fabricating a solid state light emitting device may further comprise the step of providing a first contacting structure on the light-generating quantum well layer of each of the base structures and a second contacting structure electrically contacting the base structure.

According to one embodiment of the present invention the first contacting structure may advantageously comprise a charge carrier confinement layer arranged on the surface of the light-generating quantum well layer followed by a conducting layer on the surface of the confinement layer. The charge carrier confinement layer is part of a hetero structure forming the quantum well, where the function of the confinement layer is to define one of the boundaries of the quantum well, providing an energy barrier between the quantum well and the neighboring material. The opposite quantum well boundary is formed by the base structure. As an example, the charge carrier confinement layer may be an electron-blocking layer and the conducting layer may comprise a p-doped hole conduction layer with contacts arranged on the conducting layer. The device can be contacted as planar grown LEDs, i.e. by applying proper contacting layers to both the n-doped growth layer and the p-doped top layer.

The contacts may be formed on opposite sides of the device or they may both be on the same side of the device. When both contacts are arranged on the same side, the device may be formed either with transparent contacts and mounted such that light is extracted on the same side as the contacts. Alternatively, the contacts may be reflective and mounted as a flip chip in which case light is extracted from the opposite side of where the contacts are arranged.

In one embodiment of the present invention, the step of providing the mask layer may comprise the steps of depositing a mask layer material on the growth surface and selectively removing mask layer material according to a predefined pattern to form the aforementioned openings.

According to one embodiment of the present invention, patterning of the mask layer may advantageously be done by nano-imprinting. By using a patterning method such as surface conformal nano-imprinting, patterning can be done on wafer scale in a single process step. Additionally, problems with wafer bending associated with other lithography methods can be reduced or even avoided. A pattern may advantageously be imprinted in deformable silica provided in the form of sol-gel derived $SiO_2$, there forming a plurality of depressions corresponding to a predefined imprinting template. After nano-imprinting, a thin residual layer of silica may remain at the bottom of the depressions. The residual layer may preferably be removed by selectively etching the mask layer material with respect to the underlying growth layer where the removal, for example, can be done using reactive ion etching (RIE). Other patterning methods are also available such as stepper lithography, e-beam lithography and holographic interference lithography. Suitable mask removal methods would be used for the respective lithography methods.

According to a second aspect of the present invention, it is provided a solid state light emitting device comprising: a substrate having a growth surface; a mask layer on the growth surface, the mask layer having a plurality of openings, wherein a largest lateral dimension of each of said openings is less than 0.3 µm and wherein the mask layer comprises a first mask layer portion and a second mask layer portion, having the same surface area and comprising a plurality of openings wherein the first mask layer portion exhibits a first ratio between the opening area and the mask layer area, and wherein the second mask layer portion exhibits a second ratio between the opening area and the mask layer area, the second ratio being different from the first ratio; an at least partially crystallographically relaxed base structure grown on the growth surface in each of the openings of the mask layer; and a light-generating quantum well layer grown on the surface of each of the base structures.

Effects and features of this second aspect of the present invention are largely analogous to those described above in connection with the first embodiment. However, some additional features will be discussed.

According to an embodiment of the solid state light emitting device according to the present invention, the base structures may advantageously protrude above the mask layer. The grown base structures are not necessarily limited by the thickness of the mask layer, on the contrary, they may instead protrude above and extend beyond the openings in the mask layer. For continued growth after the structures have protruded above the mask layer the structures may also extend in a lateral direction. Allowing extended growth provides another possibility to tune the size and geometry of the base structures and quantum wells in addition to the geometrical disposition of the openings discussed in relation to the first aspect of the present invention.

According to one embodiment of the present invention, the growth surface may advantageously comprise a GaN or InGaN growth layer arranged on the carrier substrate. From the growth layer a GaN or InGaN base structure may be grown followed by an InGaN quantum well layer. It would also be possible to use other material combinations, preferably from the III-V group of semiconductor-based materials, and more preferably from the subset of nitride based III-N materials.

BRIEF DESCRIPTION OF THE DRAWINGS

These and other aspects of the present invention will now be described in more detail with reference to the appended drawings showing exemplary embodiments of the invention, wherein:

FIG. 1A is a flow-chart schematically illustrating a portion of an exemplary manufacturing method according to an exemplary embodiment of the present invention;

FIG. 1B is a flow-chart schematically illustrating a portion of an exemplary manufacturing method according to an exemplary embodiment of the present invention;

FIGS. 2a-h schematically illustrate the steps of the method illustrated by the flow-chart in FIG. 1;

DETAILED DESCRIPTION

Figure 3B:
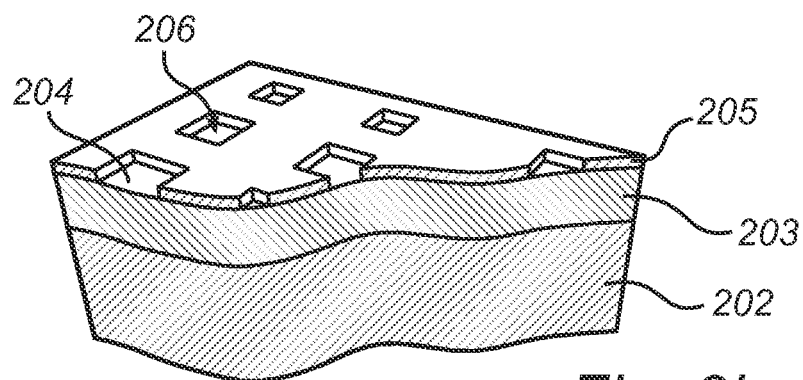
FIGS. 3a-c schematically illustrate an intermediate step in the fabrication method for making a solid state light emitting device according to an exemplary embodiment of the present invention.

In the following detailed description, various embodiments of the method for manufacturing solid state light emitting devices according to the present invention are mainly discussed with reference to a method based on growth of relaxed semiconductor structures as a base for light emitting diodes.

It should be noted that this by no means limits the scope of the present invention which is equally applicable to passive devices emitting light through photoluminescent emission. Manufacturing methods using variations of the processing steps described below are also possible. As an example, other mask patterning methods such as photolithography or e-beam lithography may be used. Furthermore, the method is equally applicable for other material combinations, primarily comprising materials from the III-V group of semiconductor-based material. Also, growth methods may be selected from a range of methods enabling epitaxial growth, for instance, MBE may be used instead of MOVPE.

An exemplary method according to an embodiment of the present invention will now be described with reference to the flow-chart shown in FIG. 1A and FIG. 1B together with FIGS. 2a-2h schematically illustrating the device in different stages of the manufacturing process.

In a first step 101, a substrate 201 having a growth surface 204 is provided as shown in FIG. 2a. A suitable substrate can be a sapphire or a doped silicon carbide (SiC) wafer. As an example, a GaN layer 203 is deposited on the surface of the sapphire wafer 202 to form a growth surface 204 as shown in FIG. 2a. Growth surfaces consisting of a so called buffer layer of relaxed GaN obtained by hetero-epitaxial growth of GaN on commonly used substrates are well-suited. At least the top of this GaN-layer is n-doped for fabricating an electroluminescent device.

In the next step 102, a mask layer 205 is provided as illustrated in FIG. 2b. A deformable precursor layer to the mask layer is deposited on the GaN growth surface. The deformable precursor is in this embodiment sol-gel derived $SiO_2$.

In the following step 103, the mask layer 205 is patterned. Patterning is done by imprinting the precursor layer over the entire area of the wafer in a single step using surface conformal nano imprinting (SCIL), resulting in depressions in the form of squares in the silica layer as shown in FIG. 2c. The largest lateral dimension of each of the depressions is less than 0.3 µm. As a result of imprinting, there may be a thin residual layer of silica at the bottom of the depressions. The remaining silica at the bottom of the depressions can be removed through reactive ion etching, forming openings 206 exposing the GaN growth surface 204. The etching of the silica is preferably selective with respective to the GaN growth surface 204.

In the subsequent step 104 of growing the base structures 207, as is schematically illustrated in FIG. 2d, InGaN base structures 207 are grown on the exposed GaN growth surface 204 in each of the openings 206 of the mask layer 205. InGaN growth may, for example, be done in a metalorganic vapor phase epitaxy (MOVPE) reactor and the In content is determined by the trimethylindium (TMI) to triethylgallium (TEG) precursor ratio. A variation in In content may also be achieved by adapting the temperature during growth. The epitaxially grown InGaN base structures 207 only nucleate in the openings 206 at the GaN surface 204 and no growth takes place on the surface of the silica mask layer. Due to the limited dimensions of the openings 206, the resulting InGaN base structures 207 have a relaxed crystal structure. The shape of the base structures 207, when grown in the manner as described in the present embodiment using square openings, is a square pyramid. Depending on growth time the top of the pyramid might be flat. The shape of the top is not critical to the function of the light emitting device and shapes such as conventional pyramids are equally possible. The base structures 207 may or may not protrude above the mask layer 205 depending on the mask layer thickness and growth time of the base structures 207. In the present embodiment, base structure growth is stopped before coalescence, but it would in principle be equally possible to fabricate light emitting devices from coalesced structures, provided that the base structures remain crystallographically relaxed.

In the next step 105, illustrated in FIG. 2e, a thin light-generating quantum well layer 208 is grown on the surface of the base structures 207. The epitaxially grown quantum well layer 208 only grows on the base structure 207 and no growth takes place on the surface of the mask layer 205. In this embodiment, the quantum well layer 208 comprises InGaN having a higher In content than the base structure 207. The relaxed crystal structure of the base structure 207 leads to the incorporation of a higher In content in the quantum well layer 208 compared to what is incorporated on non-relaxed base structures under the same conditions. By increasing the In content, the band gap is reduced sufficiently so as to allow the emission of green or red light. In another embodiment, the base structures 207 can be made of GaN with an InGaN quantum well for fabrication of light sources emitting blue light.

The next step 106, illustrated in FIG. 2f, is the deposition of a charge carrier confinement layer 209. In the present embodiment, the charge carrier confinement layer 209 comprises an aluminum gallium nitride (AlGaN) electron blocking layer.

In the next step 107 illustrated in FIG. 2g a conducting layer 210 is deposited. The deposition of a conducting layer 210 comprises deposition of a p-doped InGaN layer and followed by a $p^{++}$-doped InGaN layer.

The final step 108 in the method according to an embodiment of the present invention is illustrated in FIG. 2h where a contact layer 211 is deposited in the form of an electrically conductive contact material such as ITO (Indium Tin Oxide) or Pd/Au. Conventional processing can subsequently be used to define the p-contacts and n-contacts. Contacts to the n-doped side of the device may be achieved either through holes etched in the top-layers or via substrate removal and contacts at the n-doped side. The derived solid state lighting device itself may be continuous or segmented to enable differentiated contacting to individual (base) structures over the device area.

Figure 3A:
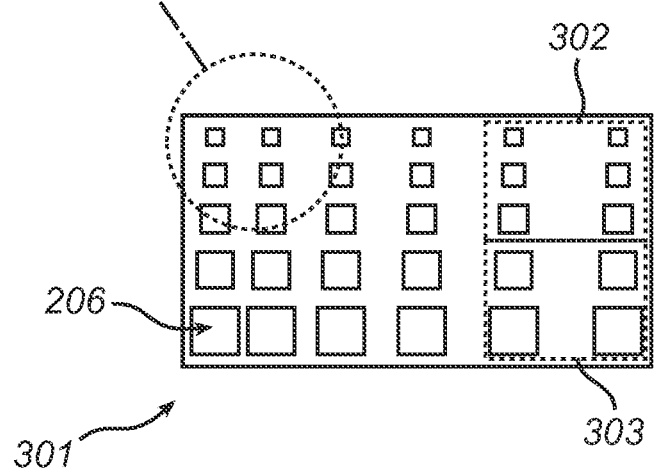

FIG. 3a illustrates device having a pattern 301 where the size and separation distance of the openings 206 in the mask layer varies over the surface of the device. By varying the size and separation distance of the openings 206 as outlined it is possible to tailor the resulting light sources to emit different wavelengths on the same wafer without adding any process steps. In general, having a smaller opening to mask ratio, as illustrated in the top part 302 of FIG. 3a, result in a thicker quantum well layer which in turn gives emission at a higher wavelength compared to an area with a larger opening to mask ratio 303. As an example, by combining multiple wavelengths it is possible to fabricate devices emitting white light. As another example, by segmenting and separately contacting areas emitting different wavelengths, a color tunable device can be made.

FIG. 3b illustrates the openings 206 in the mask layer 205 exposing the growth surface 204 prior to growth of base structures.

Figure 3C:
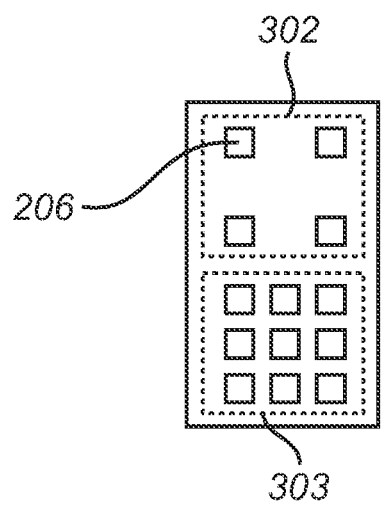

FIG. 3c schematically illustrates a device having openings of the same size but where the separation distance of the openings is different in different regions of the device. In particular, in a first region (302) the distance between the openings are larger than in a second region (303) which leads to a different density of openings.

Figure 4A:
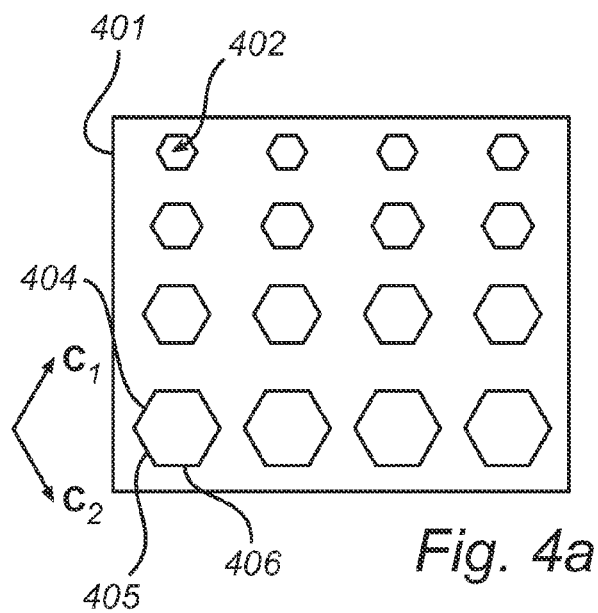
FIGS. 4a-b schematically illustrates alternative light source patterns for solid state light emitting device according to various embodiments of the present invention.
Figure 4B:
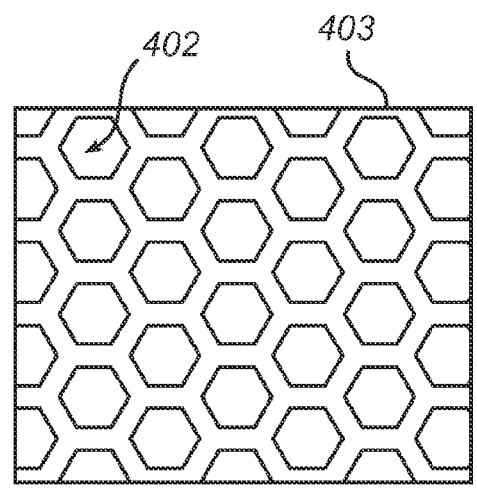

FIG. 4a schematically illustrates a possible shape of the openings in the mask layer where a hexagonal shape 402 enables alignment along specific crystal directions in the underlying growth surface. As an example, two schematic crystal directions of the growth surface, $c_1$ and $c_2$, are shown. It is also shown that a hexagonal opening may be aligned so that it has sides (404, 405) substantially parallel to the crystal directions. By aligning the sides of the grown base structures to a desired underlying crystallographic orientation, making all sides of the structure equivalent, it is possible to achieve a higher uniformity and thereby more controlled emission properties. An even higher degree of uniformity can be obtained when the hexagonal openings 402 are packed in a hexagonal pattern 403 as illustrated in FIG. 4b, as then also the distances between adjacent hexagons can be chosen constant.

As an example, aligning a hexagonal configuration of openings along the low-index orientation on a GaN surface implies that all opening walls will be either along the (10-10) or (11-20) direction.

As another example, triangular openings oriented along the major low-index crystallographic axis on the C-plane of GaN will lead to well defined crystallographic growth of equivalent crystal planes.

As yet another example, when growing structures on the M-plane, A-plane or R-plane of sapphire, all exhibiting a rectangular symmetry, at least two different sets of planes are initially grown and the ratio between the planes can be tuned by selecting the size shape and orientation of the opening.

The person skilled in the art realizes that the present invention by no means is limited to the preferred embodiments described above. On the contrary, many modifications and variations are possible within the scope of the appended claims. For example, the method according to the present invention may also be used to fabricate vertical cavity emitting lasers (VCSELs) and laser diodes (LDs). Additionally, LEDs having been fabricated according to the method described above but with different material compositions are equally possible. Also, by omitting the n-type and p-type doping as well as the contacting layers, the resulting structure is well suited to act as a photoluminescent emitter with most of the properties with respect to wavelength tuning and selection as described above. Such a material could be directly illuminated by a suitable UV or blue emitting light source or through a waveguide structure. Furthermore, the basic principle of the present invention may also be applied to the fabrication of group III-V based semiconductor-based devices in general by providing a surface for growth having the desired properties related to lattice parameters and strain levels.

The invention claimed is:

1. A device comprising:
   a growth substrate;
   a base layer grown over the growth substrate, the base layer comprising a first region and a second region, wherein the first and second regions of the base layer are pyramids having flat tops;
   a mask layer disposed over the growth substrate, wherein the first region of the base layer is grown in a first opening in the mask layer and the second region of the base layer is grown in a second opening in the mask layer, wherein the first opening and the second opening are substantially the same size, wherein a largest lateral dimension of the first opening is less than 0.3 µm; and
   a light emitting layer grown over the base layer, wherein a first portion of the light emitting layer grown over the first region is thinner than a second portion of the light emitting layer grown over the second region.

2. A device comprising:
   a growth substrate;
   a base layer grown over the growth substrate, the base layer comprising a first region and a second region, wherein the first and second regions of the base layer are pyramids having flat tops;
   a mask layer disposed over the growth substrate, wherein the first region of the base layer is grown in a first opening in the mask layer and the second region of the base layer is grown in a second opening in the mask layer, wherein the first opening and the second opening are substantially the same size, wherein at least one of the first and second openings is hexagonal; and
   a light emitting layer grown over the base layer, wherein a first portion of the light emitting layer grown over the first region is thinner than a second portion of the light emitting layer grown over the second region.

3. The device of claim 1 wherein the first portion and the second portion emit different colors of light.

4. The device of claim 1 wherein the first and second portions of the light emitting layer each comprise segments grown on sidewalls of the first and second regions of the base layer.

5. The device of claim 1 wherein:
the first opening in the mask layer corresponds to a first mask region having a first ratio between an exposed area of the growth surface and an unexposed area of the growth substrate;
the second opening in the mask layer corresponds to a second mask region having a second ratio between an exposed area of the growth surface and an unexposed area of the growth substrate; and
the first ratio is different from the second ratio.

6. A device comprising:
a growth substrate;
a base layer grown over the growth substrate, the base layer comprising a first region and a second region, wherein the first and second regions of the base layer are pyramids having flat tops; and
a light emitting layer grown over the base layer, wherein a first portion of the light emitting layer grown over the first region is thinner than a second portion of the light emitting layer grown over the second region;
wherein the first opening and the second opening each have a polygon shape, and at least one side of each of the first opening and the second opening is aligned parallel to a crystallographic orientation of the growth substrate.

7. The device of claim 1 wherein the second portion emits red light.

8. A device comprising:
a growth substrate;
a base layer grown over the growth substrate, the base layer comprising a first region and a second region;
a light emitting layer grown over the base layer, wherein a first portion of the light emitting layer grown over the first region is thinner than a second portion of the light emitting layer grown over the second region; and
a mask layer disposed over the growth substrate, wherein the first region of the base layer is grown in a first opening in the mask layer and the second region of the base layer is grown in a second opening in the mask layer, and wherein the first opening and the second opening are substantially the same size;
wherein the first opening and the second opening each have a polygon shape, and at least one side of each of the first opening and the second opening is aligned parallel to a crystallographic orientation of the growth substrate.

9. The device of claim 8 wherein a largest lateral dimension of the first opening is less than 0.3 pm.

10. The device of claim 8 wherein at least one of the first and second openings is hexagonal.

11. The device of claim 8 wherein the first portion and the second portion emit different colors of light.

12. The device of claim 8 wherein a distance between the first and second openings is different from a distance between the second opening and a third opening in the mask layer.

13. The device of claim 8 wherein the first opening is disposed in a first mask region and the second opening is disposed in a second mask region, wherein a density of openings in the first mask region is different from a density of openings in the second mask region.

14. The device of claim 8 wherein the second portion emits red light.

15. The device of claim 6 wherein a largest lateral dimension of the first opening is less than 0.3 µm.

16. The device of claim 6 wherein at least one of the first and second openings is hexagonal.

17. The device of claim 6 wherein the first portion and the second portion emit different colors of light.

18. The device of claim 6 wherein the first and second portions of the light emitting layer each comprise segments grown on sidewalls of the first and second regions of the base layer.

19. The device of claim 6 wherein the second portion emits red light.

20. The device of claim 2 wherein the first portion and the second portion emit different colors of light.

21. The device of claim 2 wherein the first and second portions of the light emitting layer each comprise segments grown on sidewalls of the first and second regions of the base layer.

22. The device of claim 2 wherein:
the first opening in the mask layer corresponds to a first mask region having a first ratio between an exposed area of the growth surface and an unexposed area of the growth substrate;
the second opening in the mask layer corresponds to a second mask region having a second ratio between an exposed area of the growth surface and an unexposed area of the growth substrate; and
the first ratio is different from the second ratio.

23. The device of claim 2 wherein the second portion emits red light.

* * * * *